United States Patent
Huang et al.

(10) Patent No.: US 12,309,989 B2
(45) Date of Patent: May 20, 2025

(54) STACKED SRAM DEVICE

(71) Applicant: Taiwan Semiconductor Manufacturing Company, Ltd., Hsinchu (TW)

(72) Inventors: Huai-Ying Huang, New Taipei (TW); Yu-Ming Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 638 days.

(21) Appl. No.: 17/669,319

(22) Filed: Feb. 10, 2022

(65) Prior Publication Data
US 2023/0137806 A1    May 4, 2023

Related U.S. Application Data

(60) Provisional application No. 63/275,934, filed on Nov. 4, 2021.

(51) Int. Cl.
| | |
|---|---|
| H10B 10/00 | (2023.01) |
| H01L 23/535 | (2006.01) |
| H01L 25/065 | (2023.01) |
| H10D 89/10 | (2025.01) |

(52) U.S. Cl.
CPC .......... H10B 10/12 (2023.02); H01L 23/535 (2013.01); H01L 25/0657 (2013.01); H10B 10/18 (2023.02); H10D 89/10 (2025.01)

(58) Field of Classification Search
CPC ....... H10B 10/12; H10B 10/18; H01L 23/535; H01L 25/0657; H01L 27/0207; H10D 89/10
See application file for complete search history.

(56) References Cited

U.S. PATENT DOCUMENTS

| | | | | |
|---|---|---|---|---|
| 2011/0233617 A1* | 9/2011 | Or-Bach | ............... | H01L 27/092 257/202 |
| 2011/0255334 A1* | 10/2011 | Grossi | ..................... | H01L 23/48 257/E21.409 |
| 2013/0148402 A1* | 6/2013 | Chang | ..................... | G11C 8/08 365/63 |
| 2021/0242240 A1* | 8/2021 | Young | ................. | H01L 21/8221 |
| 2023/0050415 A1* | 2/2023 | Huang | ................. | H10B 10/125 |
| 2023/0140731 A1* | 5/2023 | Huang | ................ | G11C 11/4097 365/207 |

* cited by examiner

*Primary Examiner* — Herve-Louis Y Assouman
*Assistant Examiner* — Christopher M Roland
(74) *Attorney, Agent, or Firm* — JCIPRNET (57) ABSTRACT

A semiconductor device includes a semiconductor structure, a logic circuit, a plurality of first memory cells and through vias. The logic circuit is disposed at a first level over the semiconductor substrate. The first memory cells are disposed at a second level over the semiconductor substrate, wherein the second level is stacked on top and overlapped with the first level. Each of the first memory cells include a latch circuit and conductive elements. The latch circuit is formed of N-type field effect transistors (NFETs) and P-type field effect transistors (PFETs). The conductive elements are extending above the NFETs and the PFETs and electrically coupled to the NFETs and the PFETs. The through vias are extending from the second level to the first level and electrically connecting the conductive elements to the logic circuit by a vertical conduction path.

20 Claims, 10 Drawing Sheets

STACKED SRAM DEVICE

CROSS-REFERENCE TO RELATED APPLICATION

This application claims the priority benefit of U.S. provisional application Ser. No. 63/275,934, filed on Nov. 4, 2021. The entirety of the above-mentioned patent application is hereby incorporated by reference herein and made a part of this specification.

BACKGROUND

New semiconductor applications are ever changing our lives, from new smartphones, to healthcare, factory automation and artificial intelligence. Memory working in background plays an important role in enabling these technologies, and has drawn considerable interest along with advances in computing architectures and semiconductor technologies. Static random access memory (SRAM) is widely used as on-chip cache for microprocessors, as it is inherently fast and highly compatible with complementary metal-oxide-semiconductor (CMOS) process. However, SRAM occupies an inordinate amount of real estate on a semiconductor chip. Therefore, an ability to scale down the SRAM is critical at each generation node.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In conventional semiconductor devices, such as SRAM memory devices, the SRAM array are usually fabricated at the front-end along with the logic circuits. As the SRAM array are formed aside the logic circuits on the semiconductor substrate, a large area would be occupied, and a footprint area of the semiconductor device will be increased. In accordance with some embodiments of the present disclosure, means of scaling down the footprint area of the semiconductor device is described.

Figure 1:
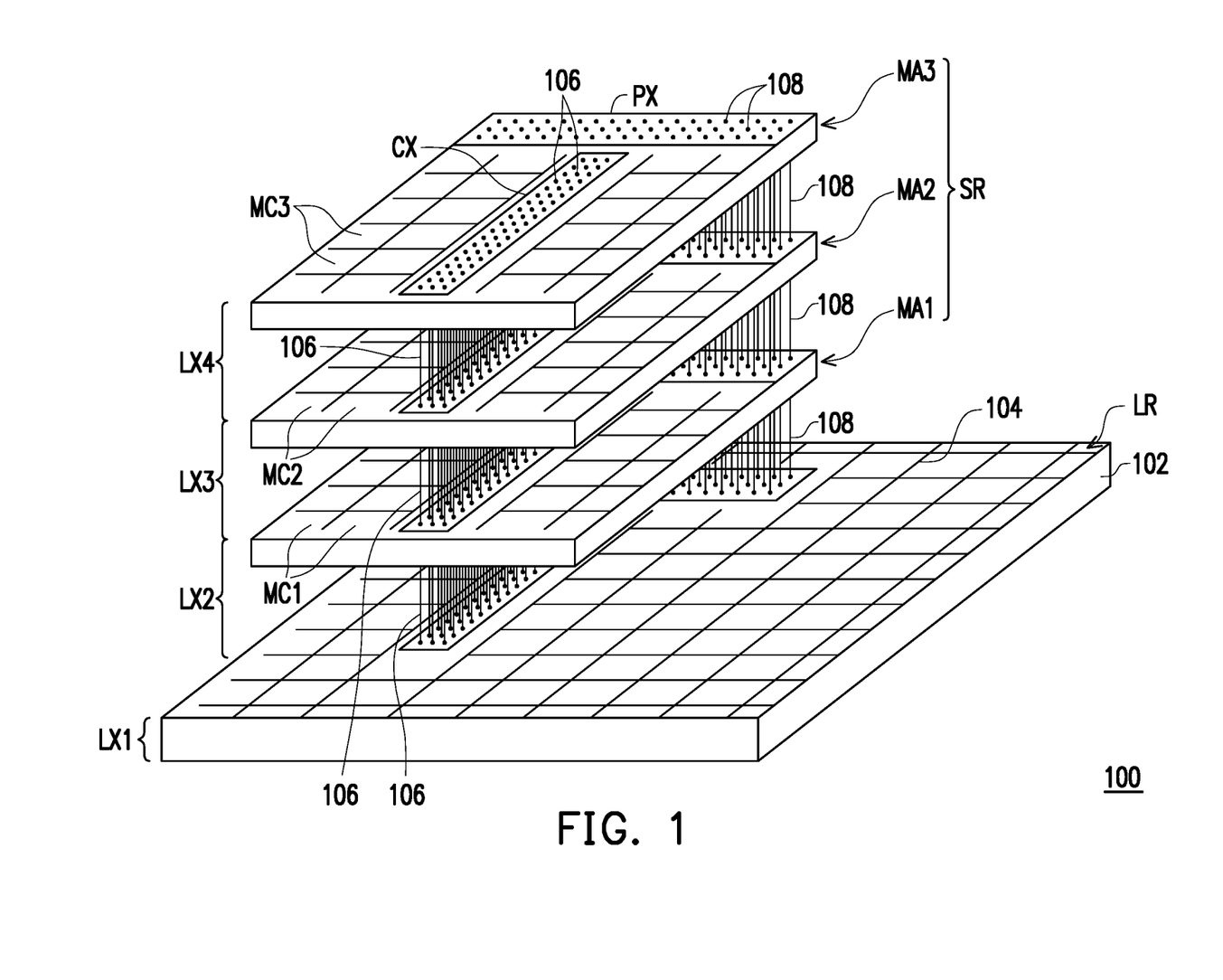
FIG. 1 is a three-dimensional view of a semiconductor device according to some embodiments of the present disclosure.

FIG. 1 is a three-dimensional view of a semiconductor device according to some embodiments of the present disclosure. Referring to FIG. 1, a semiconductor device 100 includes a logic region LR formed on a semiconductor substrate 102. In some embodiments, the semiconductor device 100 is a three-dimensional SRAM semiconductor device involving a front-end-of-line (FEOL) device stacking and a back-end-of-line (BEOL) device stacking applications. The semiconductor substrate 102 may be a semiconductor wafer, such as a silicon wafer, or the like. The logic region LR may include logic circuits 104 having active structures and gate structures formed on the semiconductor substrate 102. For example, the logic circuits 104 having active structures and gate structures are disposed at a first level LX1 (ground level) on the semiconductor substrate 102. The first level LX1 described above may be a front-end-of-line (FEOL) structure of a semiconductor device (semiconductor chip).

In some embodiments, a static random access memory (SRAM) region SR is formed on the logic region LR within an area overlapped with the logic region LR. For example, in one embodiment, the SRAM region SR is formed on the logic region LR and does not extend beyond a periphery of the logic region LR. In some embodiments, the SRAM region SR includes a first SRAM memory array MA1, a second SRAM memory array MA2 and a third SRAM memory array MA3 stacked up over the semiconductor substrate 102. The first SRAM memory array MA1 includes a plurality of first memory cells MC1 disposed at a second level LX2 over the semiconductor substrate 102. The second SRAM memory array MA2 includes a plurality of second memory cells MC2 disposed at a third level LX3 over the semiconductor substrate 102. The third SRAM memory array MA3 includes a plurality of third memory cells MC3 disposed at a fourth level LX4 over the semiconductor substrate 102. In the exemplary embodiment, the second level LX2 is stacked on top and overlapped with the first level LX1. The third level LX3 is stacked on top and overlapped with the second level LX2. The fourth level LX4 is stacked on top and overlapped with the third level LX3. In some embodiments, the second level LX2, the third level LX3 and the fourth level LX4 described above may be embedded in a back-end-of-line (BEOL) structure of a semiconductor device (semiconductor chip), and is formed over the FEOL structure.

Although three layers of stacked memory arrays are illustrated in the SRAM region SR of FIG. 1, it is noted that the disclosure is not limited thereto. For example, in some embodiments, there is only one layer of memory array in the SRAM region SR that is located on the logic region LR. In some alternative embodiments, there are two layers, three layers, four layers or more layers of memory array located on the logic region LR. In other words, the number of layers of stacked memory arrays may be adjusted based on design requirement.

As further illustrated in FIG. 1, in some embodiments, through vias 106 are electrically connecting the first SRAM memory array MA1, the second SRAM memory array MA2 and the third SRAM memory array MA3 to the logic region LR. For example, the through vias 106 are located in a central region CX of the first SRAM memory array MA1 extending from the second level LX2 to the first level LX1, and provides a vertical conduction path electrically connecting the first SRAM memory array MA1 to the logic region LR. Similarly, the through vias 106 are further located in a central region CX of the second SRAM memory array MA2 extending from the third level LX3 to the second level LX2, and provides the vertical conduction path electrically connecting the second SRAM memory array MA2 to the first memory array MA1 and the logic region LR. In a similar way, the through vias 106 are further located in a central region CX of the third SRAM memory array MA3 extending from the fourth level LX4 to the third level LX3, and provides the vertical conduction path electrically connecting the third SRAM memory array MA3 to the second SRAM memory array MA2, the first SRAM memory array MA1 and the logic region LR.

In some embodiments, auxiliary through vias 108 may be further provided on a peripheral region PX of each of the first SRAM memory array MA1, the second SRAM memory array MA1 and the third SRAM memory array MA3 to electrically connect these memory arrays (MA1, MA2, MA3) to the logic region LR. In other words, the auxiliary through vias 108 also extend from the fourth level LX4 to the third level LX3, from the third level LX3 to the second level LX2, and from the second level LX2 to the first level LX1, to provide a second vertical conduction path of the these memory arrays (MA1, MA2, MA3) to the logic region LR.

Figure 2A:
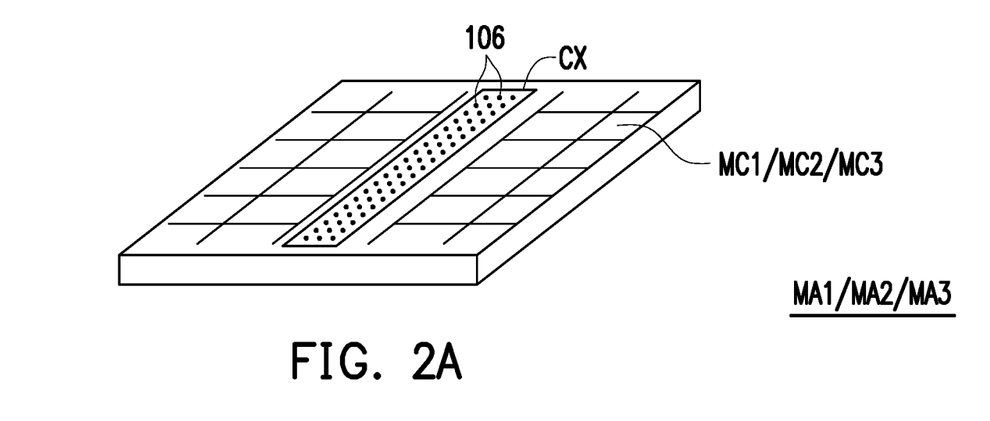
FIG. 2A and FIG. 2B are three-dimensional views of a memory array in a semiconductor device according to various embodiments of the present disclosure.
Figure 2B:
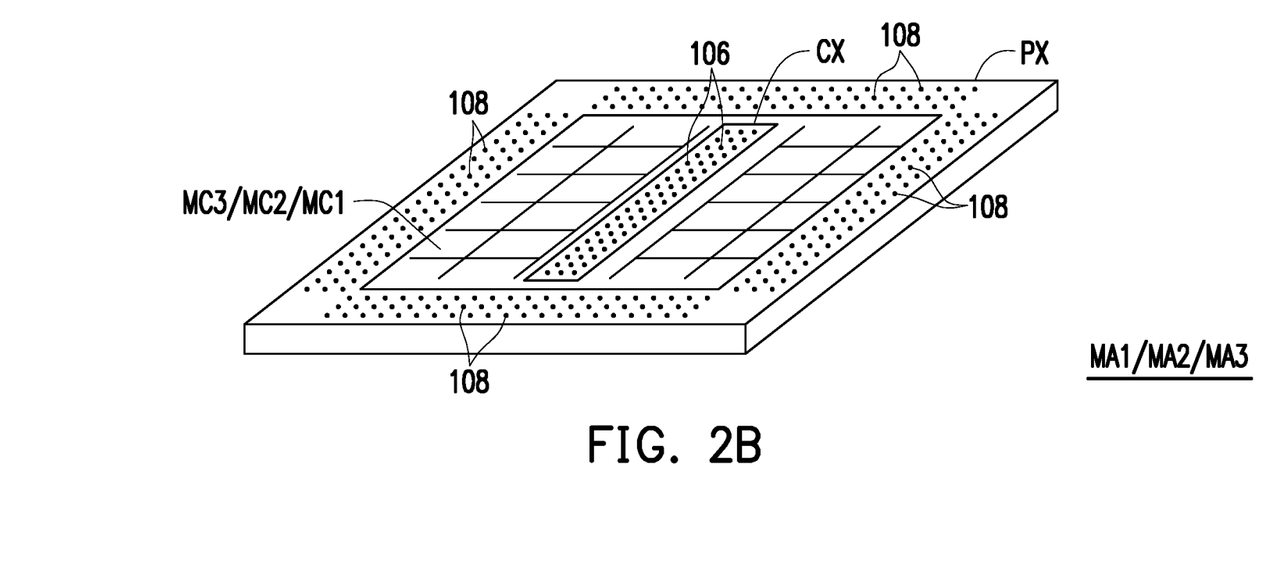

FIG. 2A and FIG. 2B are three-dimensional views of a memory array in a semiconductor device according to various embodiments of the present disclosure. In the embodiment illustrated in FIG. 1, each of the memory arrays (MA1, MA2, MA3) are connected to the logic region LR by through vias 106 located in the central region CX and auxiliary through vias 108 located in the peripheral region PX. However, the disclosure is not limited thereto. For example, as illustrated in FIG. 2A, in one embodiment, each of the memory arrays (MA1, MA2, MA3) may be connected to the logic region LR by the through vias 106 in the central region CX, while the auxiliary through vias 108 in the peripheral region PX are omitted. As illustrated in FIG. 2B, in an alternative embodiment, each of the memory arrays (MA1, MA2, MA3) may be connected to the logic region LR by the through vias 106 in the central region CX. Furthermore, each of the memory arrays (MA1, MA2, MA3) may be connected to the logic region LR by the auxiliary through vias 108 that are located in a peripheral region PX that surrounds (or encircles) the memory cells (MC1, MC2, MC3) and the central region CX. From these embodiments, it is noted that the routing arrangements of the memory arrays (MA1, MA2, MA3) for electrical connection to the logic region LR located below is not particularly limited, and may be adjusted based on design requirements.

Figure 3:
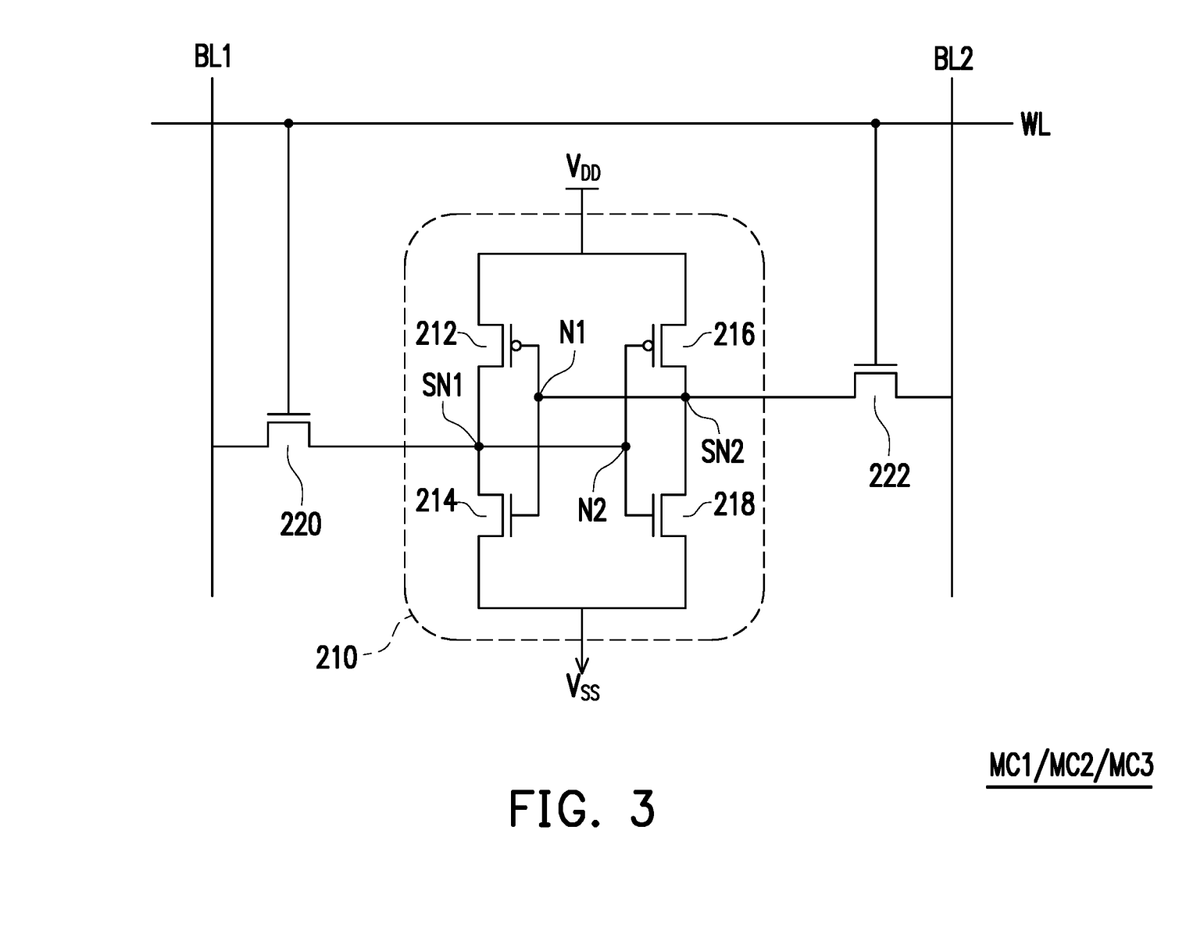
FIG. 3 is a circuit diagram of a memory cell in a semiconductor device according to some embodiments of the present disclosure.

FIG. 3 is a circuit diagram of a memory cell in a semiconductor device according to some embodiments of the present disclosure. The circuit diagram may correspond to each of the memory cells (MC1, MC2, MC3) located in the memory arrays (MA1, MA2, MA3). In some embodiments, the memory cells (MC1, MC2, MC3) may be a 6T (six transistor) SRAM cell. As illustrated in FIG. 3, the memory cells (MC1, MC2, MC3) includes a latch circuit 210.

The latch circuit 210 is configured to retain stored data without being periodically refreshed. In some embodiments, the latch circuit 210 includes two inverters. A first inverter may include a pull up transistor 212 and a pull down transistor 214. The pull up transistor 212 may be a P-type field effect transistor (PFET), while the pull down transistor 214 may be an N-type field effect transistor (NFET). The pull up transistor 212 and the pull down transistor 214 share a common source/drain terminal, and such common source/drain terminal may be referred as a storage node SN1 of the memory cell (MC1, MC2, MC3). In addition, the other source/drain terminal of the pull up transistor 212 is coupled to a working voltage $V_{DD}$. On the other hand, the other source/drain terminal of the pull down transistor 214 is coupled to a reference voltage Vss, such as a ground voltage. Furthermore, gate terminals of the pull up transistor 212 and the pull down transistor 214 are connected with each other. A node N1 coupled to the gate terminals of the pull up transistor 212 and the pull down transistor 214 may be an input terminal of the first inverter, and the storage node SN1 may be an output terminal of the first inverter.

Similarly, a second inverter in the latch circuit 210 may include a pull up transistor 216 and a pull down transistor 218. The pull up transistor 216 may be a PFET, while the pull down transistor 218 may be an NFET. The pull up transistor 216 and the pull down transistor 218 share a common source/drain terminal, which may be referred as a storage node SN2 of the memory cell (MC1, MC2, MC3). The other source/drain terminal of the pull up transistor 216 is coupled to the working voltage $V_{DD}$, while the other source/drain terminal of the pull down transistor 218 is coupled to the reference voltage Vss. In addition, gate terminals of the pull up transistor 216 and the pull down transistor 218 are connected with each other. A node N2 coupled to the gate terminals of the pull up transistor 216 and the pull down transistor 218 may be an input terminal of the second inverter, while the storage node SN2 may be an output terminal of the second inverter.

The node N1 as the input terminal of the first inverter is coupled to the storage node SN2 as the output terminal of the second inverter, and the node N2 as the input terminal of the second inverter is coupled to the storage node SN1 as the output terminal of the first inverter. In other words, the first and second inverters of the latch circuit 210 are cross-coupled. As a result, the storage nodes SN1, SN2 are ensured to store complementary logic data. For instance, when a logic data "0" is stored at the storage node SN1, the P-type pull up transistor 216 may be turned on as its gate terminal is coupled to the storage node SN1, and the storage node SN2 as a source/drain terminal of the pull up transistor 216 is pulled up by the working voltage $V_{DD}$ coupled to the other source/drain terminal of the pull up transistor 216. Therefore, a logic data "1" complementary to the logic data "0" is stored at the storage node SN2.

On the other hand, the N-type pull down transistor 218 is kept in an off state as its gate terminal is also coupled to the storage node SN1 holding at the logic data "0", thus the storage node SN2 as a source/drain terminal of the pull down transistor 218 would not be pulled down by the reference voltage Vss coupled to the other source/drain terminal of the pull down transistor 218. In addition, the N-type pull down transistor 214 is turned on as its gate terminal is coupled to the storage node SN2 holding at the logic data "1", and the storage node SN1 as a source/drain terminal of the pull down transistor 214 is kept discharged by the reference voltage Vss coupled to the other source/drain terminal of the pull down transistor 214. In addition, the P-type pull up transistor 212 is kept in an off state as its gate terminal is also coupled to the storage node SN2 holding at the logic data "1", thus the storage node SN1 as a source/drain terminal of the pull up transistor 212 would not be pulled up by the working voltage $V_{DD}$ coupled to the other source/drain terminal of the pull up transistor 212. Therefore, the logic data "0" can be retained at the storage node SN1.

Moreover, the memory cell (MC1, MC2, MC3) may further include an access transistor 220. A gate terminal of the access transistor 220 is connected to a word line WL. In addition, a source/drain terminal of the access transistor 220 is coupled to the storage node SN1, while the other source/drain terminal of the access transistor 220 is connected to a bit line BL1. When the access transistor 220 is turned on, the bit line BL1 can charge/discharge the storage node SN1, or vice versa. Accordingly, logic data can be programmed to the storage node SN1, or read out from the storage node SN1. On the other hand, when the access transistor 220 is in an off state, the storage node SN1 is decoupled from the bit line BL1, and logic data cannot be written to or read out from the storage node SN1. In other words, the access transistor 220 may control access of the storage node SN1.

Similarly, access of the storage node SN2 is controlled by an access transistor 222. The word line WL for controlling switching of the access transistor 220 may also connect to a gate terminal of the access transistor 222. In this way, the access transistors 220, 222 may be switched simultaneously. In addition, a source/drain terminal of the access transistor 222 is coupled to the storage node SN2, while the other source/drain terminal of the access transistor 220 is connected to a bit line BL2. When the access transistor 222 is turned on, the bit line BL2 can charge/discharge the storage node SN2, or vice versa. Accordingly, logic data can be programmed to the storage node SN2, or read out from the storage node SN2. On the other hand, when the access transistor 222 is in an off state, the storage node SN2 is decoupled from the bit line BL2, and logic data cannot be written to or read out from the storage node SN2. During a write operation, the bit lines BL1, BL2 may receive complementary logic data, in order to overwrite the logic data previously stored at the storage nodes SN1, SN2. In addition, during a read operation, both of the bit lines BL1, BL2 are pre-charged, and one of them is slightly pulled down by the corresponding storage node. By comparing voltage difference of the bit lines BL1, BL2, the logic data stored at the storage nodes SN1, SN2 can be read out.

The arrangement of the memory cell (MC1, MC2, MC3) will be described in more details by referring to FIG. 4A to FIG. 5B. The first memory cell MC1 located at the second level LX2 will be used as an example for description, but it should be noted that the arrangements shown in FIG. 4A to FIG. 5B may be applied to the memory cells (MC2, MC3) located at other levels.

Figure 4A:
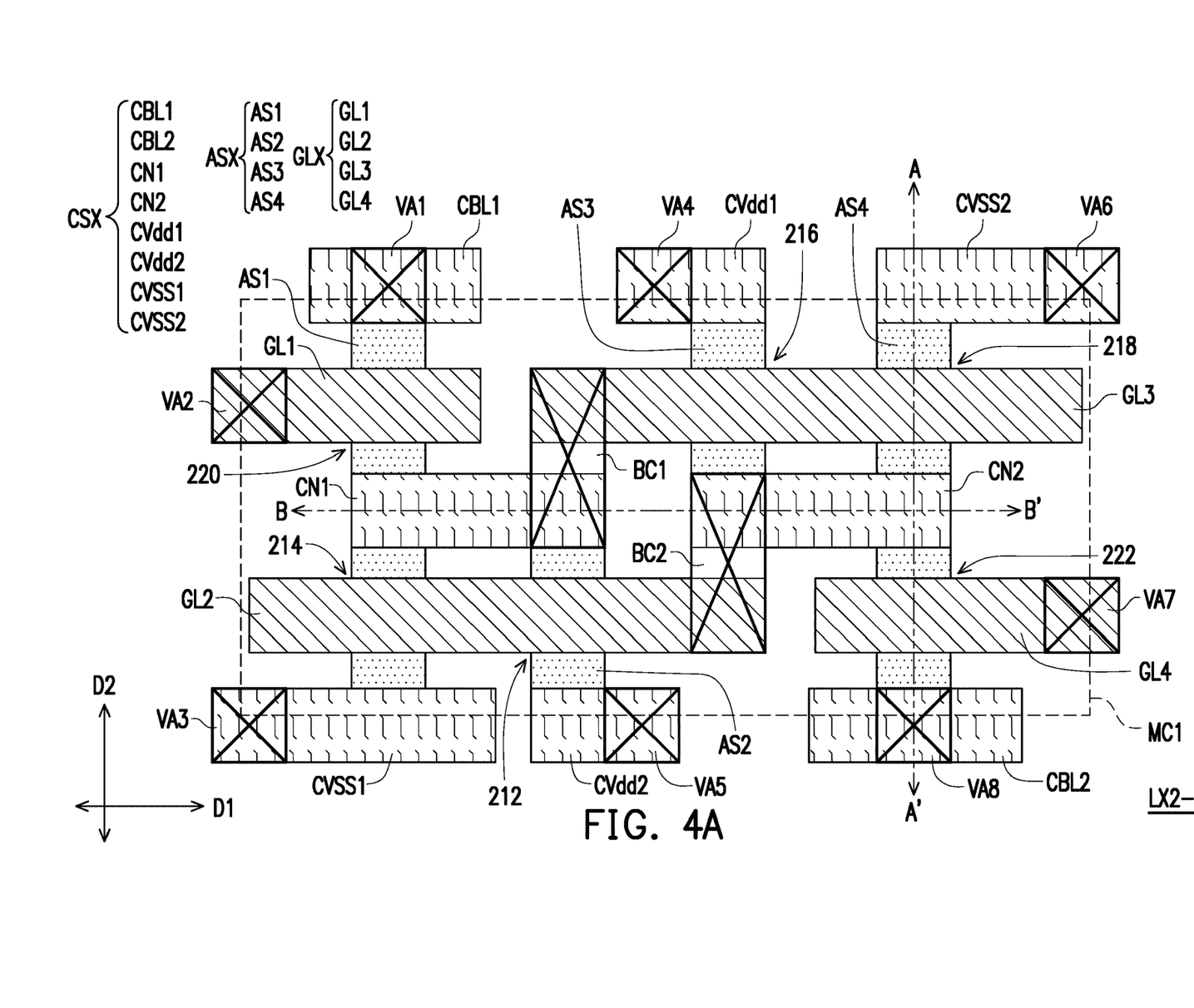
FIG. 4A is a top view illustrating a first section of memory cell located at a second level over a semiconductor substrate according to some embodiments of the present disclosure.

FIG. 4A is a top view illustrating a first section LX2-*a* of the first memory cell MC1 located at a second level LX2 over a semiconductor substrate 102 according to some embodiments of the present disclosure. As illustrated in FIG. 4A, NFETs including the pull down transistors 214, 218 and the access transistors 220, 222 in each first memory cell MC1 are formed at the second level LX2 (first section LX2-*a*) over the logic region LR of the semiconductor substrate 102. Similarly, PFETs including the pull up transistors 212, 216 in each first memory cell MC1 may be formed at the second level LX2 (first section LX2-*a*) over the logic region LR of the semiconductor substrate 102.

In some embodiments, each first memory cell MC1 includes a plurality of gate lines GLX. The gate lines GLX includes a first gate line GL1, a second gate line GL2, a third gate line GL3 and a fourth gate line GL4 extending along a first direction D1. The first gate line GL1, the second gate line GL2, the third gate line GL3 and the fourth gate line GL4 are formed at the second level LX2 (first section LX2-*a*) and spaced apart from one another. In some embodiments, each first memory cell MC1 further includes a plurality of active structures ASX. The active structures ASX includes a first active structure AS1, a second active structure AS2, a third active structure AS3 and a fourth active structure AS4 extending along a second direction D2, wherein the second direction D2 is perpendicular to the first direction D1. The first active structure AS1, the second active structure AS2, the third active structure AS3 and the fourth active structure AS4 are formed at the second level LX2 (first section LX2-*a*) and spaced apart from one another. Source/drain structures (not shown) may be formed in portions of the active structure ASX at opposite sides of the gate line GLX.

In some embodiments, the pull down transistor 214 and the access transistor 220 connected by a common source/drain terminal may be formed on the first active structure AS1 extending along the second direction D2. The pull up transistor 212 may be formed on the second active structure AS2, while the pull up transistor 216 may be formed on the third active structure AS3. Furthermore, the pull down transistor 218 and the access transistor 222 connected by a common source/drain terminal may be formed on the fourth active structure AS4.

In some embodiments, the first gate line GL1 is functioned as a gate terminal of the access transistor 220. The first gate line GL1 intersects and covers the first active structure AS1. In some embodiments, the second gate line GL2 is functioned as a gate terminal of the pull down transistor 214 and the pull up transistor 212. The second gate line GL2 intersects and covers the first active structure AS1 and the second active structure AS2. In some embodiments, the third gate line GL3 is functioned as the gate terminal of the pull up transistor 216 and the pull down transistor 218. The third gate line GL3 intersects and covers the third active structure AS3 and the fourth active structure AS4. In some embodiments, the fourth gate line GL4 is functioned as a gate terminal of the access transistor 222. The fourth gate line GL4 intersects and covers the fourth active structure AS4.

In some embodiments, the pull down transistors 214, 218, the pull up transistors 212, 216 and the access transistors 220, 222 are planar type field effect transistors (FETs), and the active structures ASX may be a doped region in a semiconductor material. In alternative embodiments, the pull down transistors 214, 218, the pull up transistors 212, 216 and the access transistors 220, 222 are fin type FETs or gate-all-around (GAA) FETs, and the active structures ASX may be a semiconductor fin structure or a stack of semiconductor nanosheets/rods at a surface of a semiconductor material. Since the pull down transistor 214, 218 and the access transistor 220, 222 are NFETs, the active structures AS1, AS4 may be formed with P-type. Since the pull up transistors 212, 216 are PFETs, the active structures AS2, AS3 may be formed with N-type.

As further illustrated in FIG. 4A, each of the first memory cell MC1 includes a plurality of contact structures CSX. The contact structures CSX include bit line contacts CBL1, CBL2, a first node contact CN1, a second node contact CN2, power contacts CVdd1, CVdd2, and ground contacts CVss1, CVss2. The contact structures CSX are located on the active structures ASX and located aside the gate lines GLX. The bit line contact CBL1 is electrically coupled to a source/drain terminal of the access transistor 220, and the bit line contact CBL2 is electrically coupled to a source/drain terminal of the access transistor 222. The power contact CVdd1 is electrically coupled to a source/drain terminal of the pull-up transistor 216, while the power contact CVdd2 is electrically coupled a source/drain terminal of the pull-up transistor 212. The ground contact CVss1 is electrically coupled to a source/drain terminal of the pull-down transistor 214, while the ground contact CVss2 is electrically coupled to a source/drain terminal of the pull-down transistor 218. The first node contact CN1 electrically couples together other source/drain terminals of the access transistor 220, the pull up transistor 212 and the pull down transistor 214. The second node contact CN2 electrically couples together other source/drain terminals of the access transistor 222, the pull up transistor 216 and the pull down transistor 218.

In some embodiments, a butted contact BC1 electrically couples the first node contact CN1 and the third gate line GL3, and extends above the first node contact CN1 and the third gate line GL3. Similarly, another butted contact BC2 electrically couples the second node contact CN2 and the second gate line GL2, and extends above the second node contact CN2 and the second gate line GL2.

In some embodiments, a via structure VA1 is formed on the bit line contact CBL1 for out routing one of the source/drain terminals of the access transistor 220. In some embodiments, a via structure VA2 is formed on the first gate line GL1 for out routing the first gate line GL1. In some embodiments, a via structure VA3 is disposed on the ground contact CVss1 for out routing one of the source/drain terminals of the pull down transistor 214. In some embodiments, a via structure VA4 is disposed on the power contact CVdd1 for out routing one of the source/drain terminals of the pull up transistor 216. In some embodiments, a via structure VA5 is disposed on the power contact CVdd2 for out routing one of the source/drain terminals of the pull up transistor 212. In some embodiments, a via structure VA6 is disposed on the ground contact CVss2 for out routing one of the source/drain terminals of the pull down transistor 218. In some embodiments, a via structure VA7 is formed on the fourth gate line GL4 for out routing the fourth gate line GL4. In some embodiments, a via structure VA8 is formed on the bit line contact CBL2 for out routing one of the source/drain terminals of the access transistor 222.

Figure 4B:
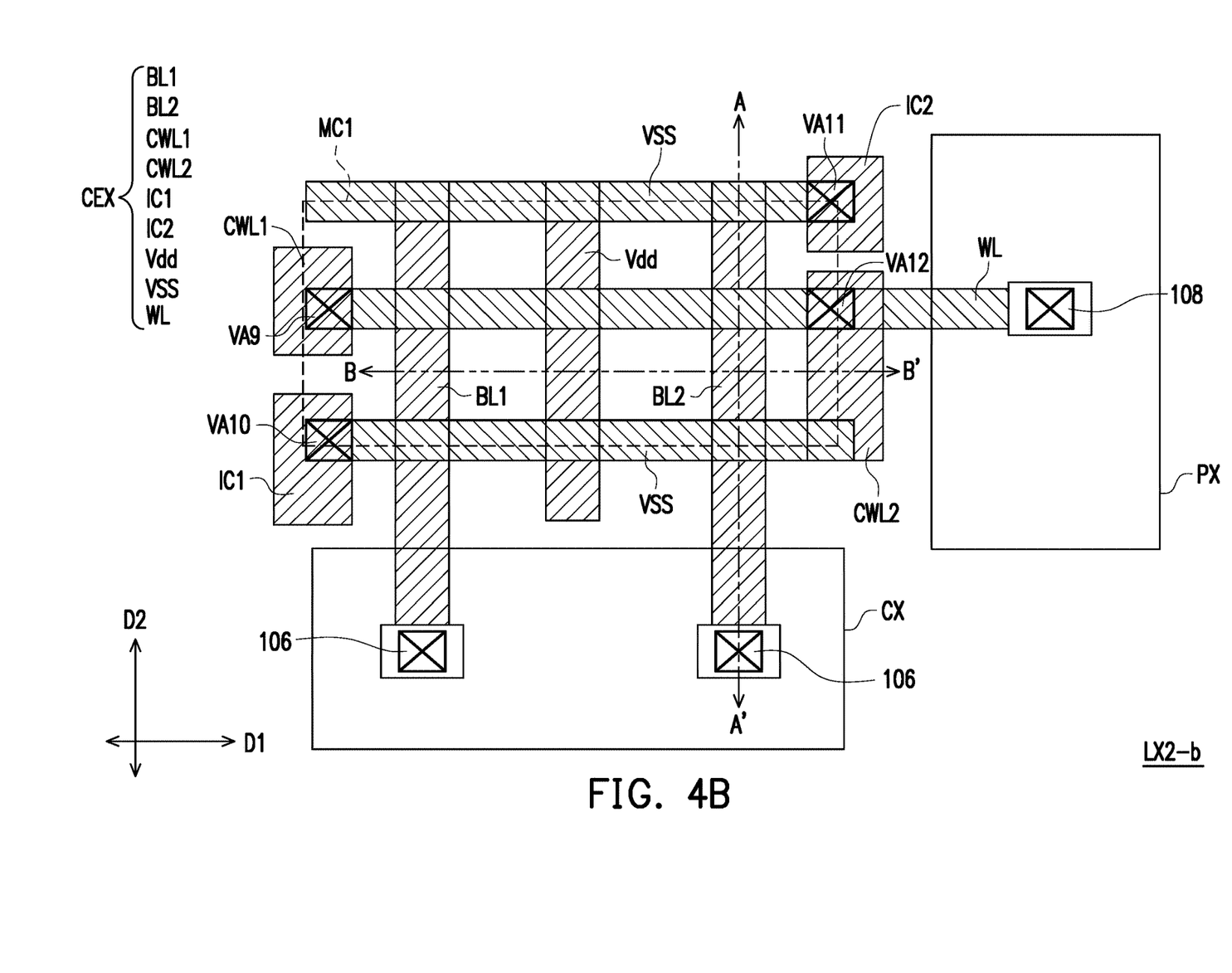
FIG. 4B is a top view illustrating a second section of memory cell located at a second level over a semiconductor substrate according to some embodiments of the present disclosure.

FIG. 4B is a top view illustrating a second section LX2-*b* of the first memory cell MC1 located at the second level LX2 over a semiconductor substrate 102 according to some embodiments of the present disclosure. The second section LX2-*b* is located above the first section LX2-*a*. As illustrated in FIG. 4B, the first memory cell MC1 further includes a plurality of conductive elements CEX extending above the pull down transistors 214, 218, the pull up transistors 212, 216 and the access transistors 220, 222. In some embodiments, the conductive elements CEX includes a first bit line BL1, a second bit line BL2, a first word line contact CWL1, a second word line contact CWL2, interconnect structures IC1, IC2, a power line Vdd, reference lines VSS, and a word line WL.

As illustrated in FIG. 4A and FIG. 4B, the first bit line BL1 extends above the first active structure AS1, and is electrically coupled to the access transistor 220 through the via structure VA1 and the bit line contact CBL1. The second bit line BL2 extends above the fourth active structure AS4, and is electrically coupled to the access transistor 222 through the via structure VA8 and the bit line contact CBL2. In some embodiments, the first bit line BL1 and the second bit line BL2 extends towards the central region CX of the first SRAM memory array MA1 (as illustrated in FIG. 1) to be physically connected to the through vias 106. For example, the through vias 106 extends from the second level LX2 to the first level LX1, and provides a vertical conduction path electrically connecting the first bit line BL1 and the second bit line BL2 to the logic region LR (as illustrated in FIG. 1).

In some embodiments, the first word line contact CWL1 extends above the first gate line GL1, and is electrically coupled to the access transistor 220 through the via structure VA2. The second word line contact CWL2 extends above the fourth gate line GL4, and is electrically coupled to the access transistor 222 through the via structure VA7. Furthermore, a word line WL extends above the first word line contact CWL1 and the second word line contact CWL2, and is electrically coupled to the first word line contact CWL1 and the second word line contact CWL2 through the via structures VA9, VA12. In some embodiments, the word line WL extends towards the peripheral region PX of the first SRAM memory array MA1 (as illustrated in FIG. 1) to be physically connected to the auxiliary through vias 108. For example, the auxiliary through vias 108 extends from the second level LX2 to the first level LX1, and provides a vertical conduction path electrically connecting the word line WL to the logic region LR (as illustrated in FIG. 1).

In some embodiments, the power line Vdd extends above the power contacts CVdd1, CVdd2 and is electrically coupled to the power contacts CVdd1, CVdd2 through the via structures VA4, VA5. In certain embodiments, the power line Vdd is a signal line coupled to the working voltage $V_{DD}$ as described with reference to FIG. 3. In some embodiments, the interconnect structures IC1, IC2 extend above the ground contacts CVss1, CVss2 and is electrically coupled to the ground contacts CVss1, CVss2 through the via structures VA3, VA6. In some embodiments, the reference lines VSS extend above the interconnect structures IC1, IC2, and is electrically coupled to the interconnect structures IC1, IC2 through the via structures VA10, VA11. In certain embodiments, the reference lines VSS indicates a signal line coupled to the reference voltage Vss as described with reference to FIG. 3.

Figure 5A:
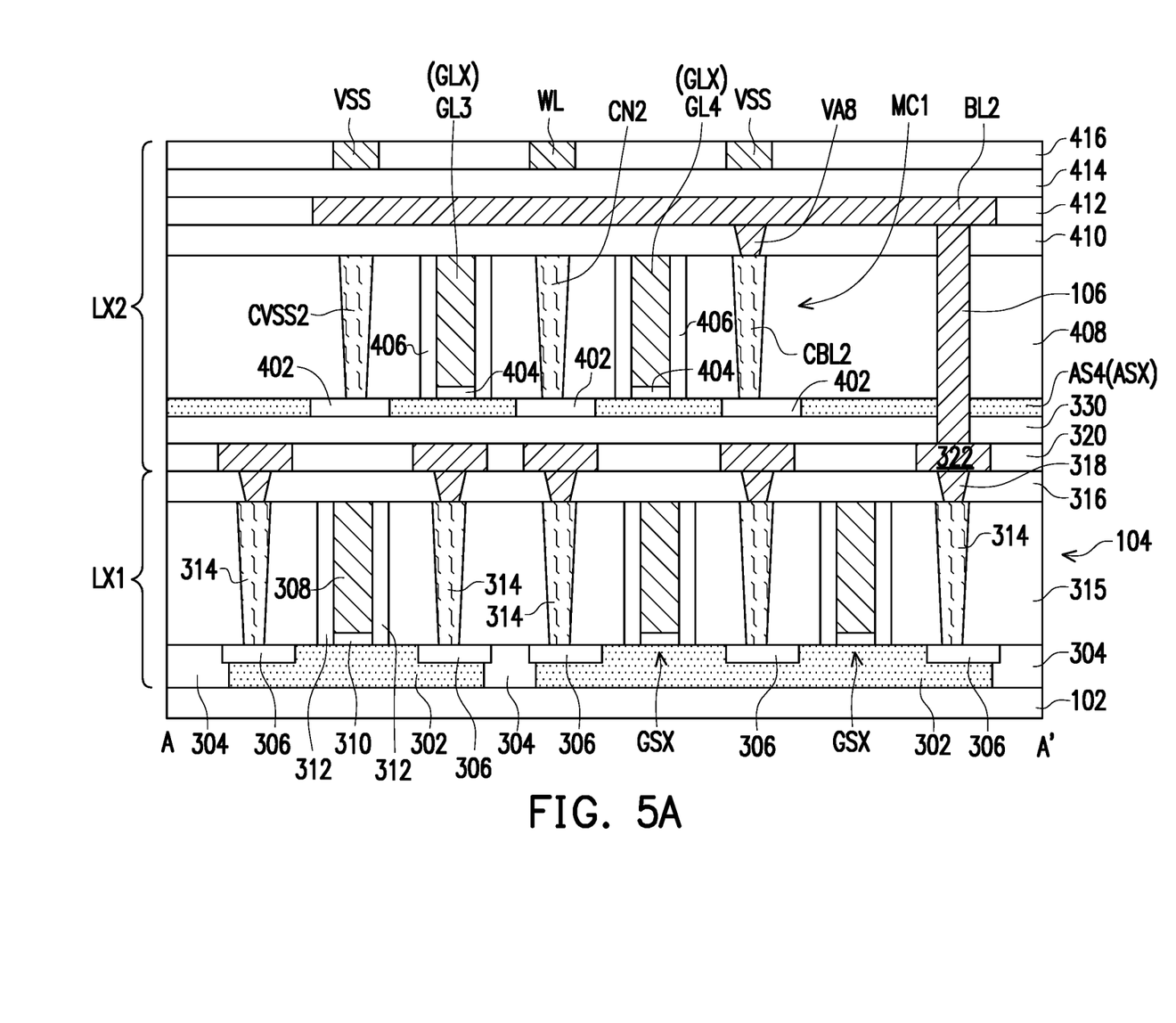
FIG. 5A is a schematic cross-sectional view of a semiconductor device taken along line A-A' shown in FIG. 4A and FIG. 4B.
Figure 5B:
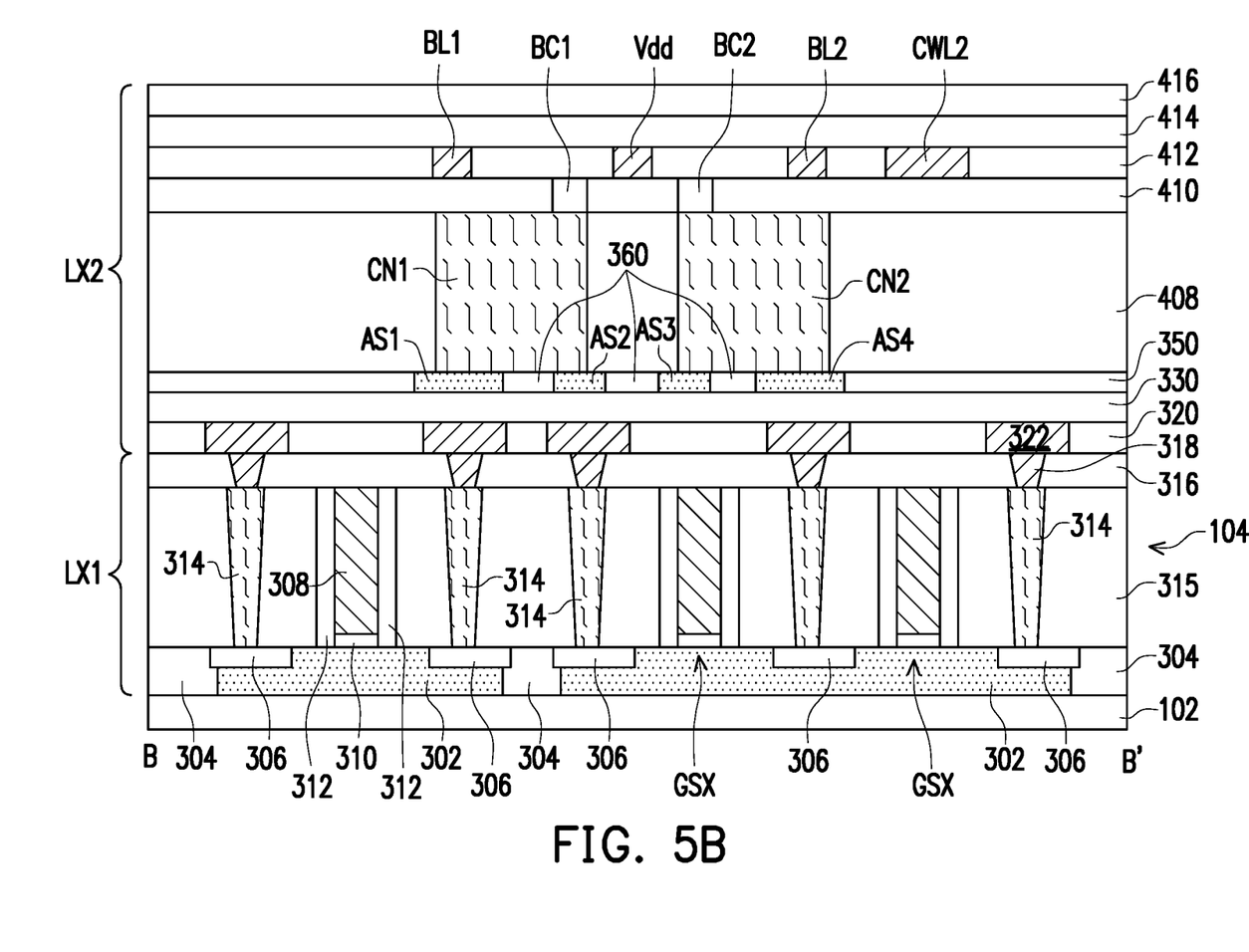
FIG. 5B is a schematic cross-sectional view of a semiconductor device taken along line B-B' shown in FIG. 4A and FIG. 4B.

FIG. 5A is a schematic cross-sectional view of a semiconductor device taken along line A-A' shown in FIG. 4A and FIG. 4B. FIG. 5B is a schematic cross-sectional view of a semiconductor device taken along line B-B' shown in FIG. 4A and FIG. 4B. The logic circuit 104 disposed at the first level LX1 over the semiconductor substrate 102, and the first memory cells MC1 disposed at the second level LX2 over the semiconductor substrate 102 will be described in more detail with reference to FIG. 5A and FIG. 5B. The same reference numerals applied in FIG. 1 to FIG. 4B may be used to refer to the same or liked parts in FIG. 5A and FIG. 5B. Therefore, the detailed description of each element may be omitted or simplified.

Referring to FIG. 5A and FIG. 5B, at the first level LX1 over the semiconductor substrate 102, logic circuits 104 having logic active structures 302 and gate structures GSX are provided. The logic active structures 302 and the gate structures GSX form a plurality of transistors on the semiconductor substrate. For example, the logic active structures 302 are disposed at the first level LX1 on the semiconductor substrate 102, and first isolation structures 304 may be formed at the first level LX1 on the semiconductor substrate 102 separating the logic active structures 302. In some embodiments, when the transistors at the first level LX are planar type FETs, then the logic active structures 302 may be a doped region in the semiconductor substrate 102. In some other embodiments where the transistors at the first level LX1 are fin type FETs or GAA FETs, then the logic active structures 302 may be a semiconductor fin structure or a stack of semiconductor nanosheets/rods formed at a surface of the semiconductor substrate 102.

In some embodiments, each transistor located at the first level LX1 may include one gate structure GSX. For example, the gate structures GSX may include a gate line 308 disposed on a logic active structure 302; a gate dielectric layer 310 lying between the gate line 308 and the logic active structure 302; and sidewall spacers 312 covering sidewalls of the gate line 308 and the gate dielectric layer 310. In some embodiments, each transistor located at the first level LX1 further includes source/drain terminals 306 (source/drain regions) located at opposite sides of the gate structure GSX. Furthermore, conductive patterns 314 and conductive vias 318 are formed on the source/drain terminals 306 for out routing the transistors in the logic region. In certain embodiments, the conductive patterns 314 and the gate structures GSX are laterally surrounded by a dielectric layer 315. Similarly, the conductive vias 318 are laterally surrounded by another dielectric layer 316.

In some embodiments, at the second level LX2 over the semiconductor substrate 102, the first memory cell MC1 described in FIG. 4A and FIG. 4B may be formed over the logic circuit 104. For example, at the second level LX2, a stack of interlayer dielectrics 320, 330 may be formed on the dielectric layer 316 covering the logic circuits 104, and interconnection patterns 322 may be embedded in the interlayer dielectric 320 for connecting to the conductive patterns 314 located at the first level LX1.

As further illustrated in FIG. 5A and FIG. 5B, active structures ASX including the first active structure AS1, the second active structure AS2, the third active structure AS3 and the fourth active structure AS4 are disposed on the interlayer dielectric 330 at the second level LX2 on the semiconductor substrate 102. In some embodiments, second isolation structures 360 are formed at the second level LX2 on the semiconductor substrate 102 and separating the active structures ASX (including AS1, AS2, AS3, AS4) from one another. For example, a height of the second isolation structures 360 may be substantially equal to a height of the active structures ASX. In some embodiments, an interlayer dielectric 350 is disposed on the interlayer dielectric 330 and surrounding the active structures ASX and the second isolation structures 360.

In some embodiments, the transistors (NFETs, PFETs) located at the second level LX2 may include gate structures having gate lines GLX (including GL1, GL2, GL3, GL4). For example, each of the gate structures may include a gate line GLX (either one of GL1, GL2, GL3, GL4) disposed on the active structures ASX; a gate dielectric layer 404 lying between the gate line GLX and the active structure ASX; and sidewall spacers 406 covering sidewalls of the gate line GLX and the gate dielectric layer 404. In some embodiments, each transistor located at the second level LX2 further includes source/drain terminals 402 formed in the active structures ASX, and located at opposite sides of the gate structure. Furthermore, contact structures CSX including include bit line contacts CBL1, CBL2, a first node contact CN1, a second node contact CN2, power contacts CVdd1, CVdd2, and ground contacts CVss1, CVss2 are formed over the source/drain terminals 402 for out routing the transistors (NFETs, PFETs) located at the second level LX2 (only the ground contact CVss2, first node contact CN1, second node contact CN2 and the bit line contact CBL2 are illustrated).

As further illustrated in FIG. 5A and FIG. 5B, via structures (including VA1-VA8) and butted contacts (including BC1, BC2) are disposed over the contact structures CSX for providing further interconnection. In some embodiments, a dielectric layer 408 is formed to surround the gate structures and the contact structures CSX. In certain embodiments, another dielectric layer 410 is formed over the dielectric layer 408 to surround the via structures (including VA1-VA8) and butted contacts (including BC1, BC2). Furthermore, conductive elements CEX including a first bit line BL1, a second bit line BL2, a first word line contact CWL1, a second word line contact CWL2, interconnect structures IC1, IC2 and a power line Vdd, reference lines VSS, and a word line WL are disposed over the dielectric layer 410 for providing further interconnection.

In some embodiments, a dielectric layer 412 is disposed on the dielectric layer 410 to surround the first bit line BL1, the second bit line BL2, the first word line contact CWL1, the second word line contact CWL2, the interconnect structures IC1, IC2 and the power line Vdd. Furthermore, dielectric layers 414, 416 are disposed on the dielectric layer 412, whereby the reference lines VSS and the word line WL are embedded in the dielectric layer 416. In the exemplary embodiment, the through vias 106 extend from the second level LX2 to the first level LX1, and provides a vertical conduction path electrically connecting the bit lines (e.g. second bit line BL2 as illustrated) to the source/drain terminal 306 of the logic circuit 104. In some embodiments, auxiliary through vias (not shown) may extend from the second level LX2 to the first level LX1, and provides a vertical conduction path electrically connecting the word line WL to the source/drain terminal 306 of the logic circuit 104.

FIG. 6A to FIG. 6E are cross-sectional views illustrating structures at various stages of manufacturing a transistor in a SRAM region according to some embodiments of the present disclosure. For example, a method of forming transistors (NFETs, PFETs) over the interlayer dielectric 330 at the second level LX2 over the semiconductor substrate 102 will be described.

Figure 6A:
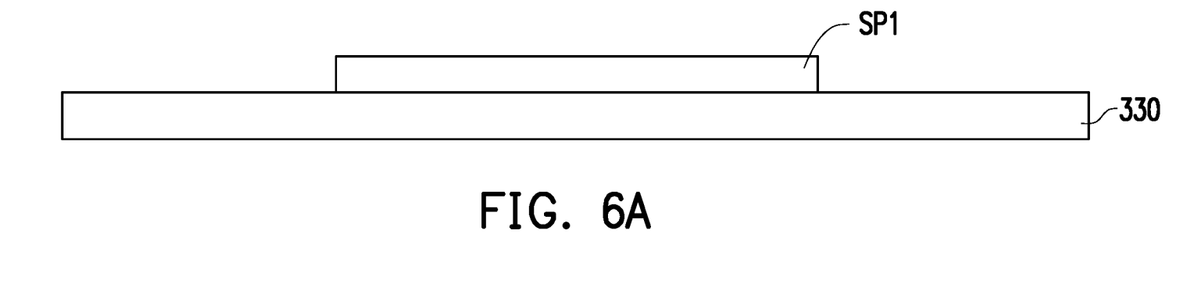
FIG. 6A to FIG. 6E are cross-sectional views illustrating structures at various stages of manufacturing a transistor in a SRAM region according to some embodiments of the present disclosure.

Referring to FIG. 6A, a semiconductor pattern SP1 may be formed on the interlayer dielectric 330. In some embodiments, a method for forming the semiconductor pattern SP1 includes globally depositing a semiconductor layer, and patterning the semiconductor layer to form the semiconductor pattern SP1 by a lithography process and an etching process. The semiconductor pattern SP1 is formed of a semiconductor material. For instance, the semiconductor material is amorphous silicon.

Figure 6B:
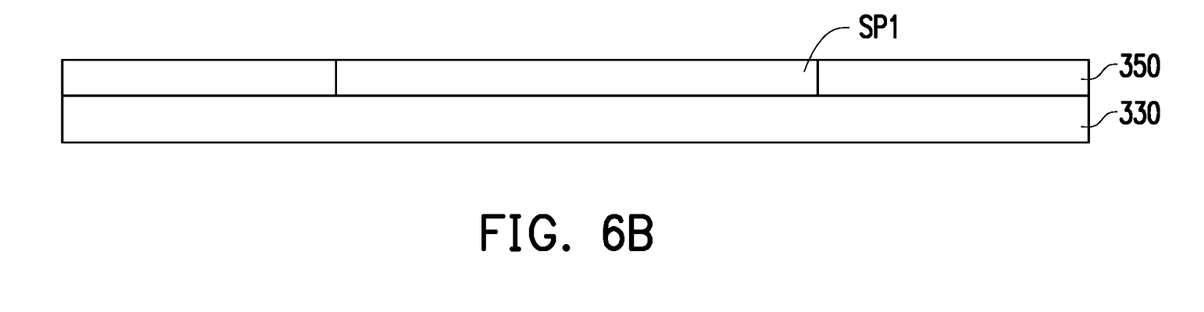

Referring to FIG. 6B, another interlayer dielectric 350 may be formed to laterally surround the semiconductor pattern SP1. In some embodiments, a method for forming the interlayer dielectric 350 includes forming a dielectric layer globally covering the semiconductor pattern SP1 and the underlying interlayer dielectric 330, and performing a planarization process to remove portions of the dielectric layer above the semiconductor pattern SP1. Remained portions of the dielectric layer form the interlayer dielectric 350. As examples, the planarization process may include a polishing process, an etching process or a combination thereof.

Figure 6C:
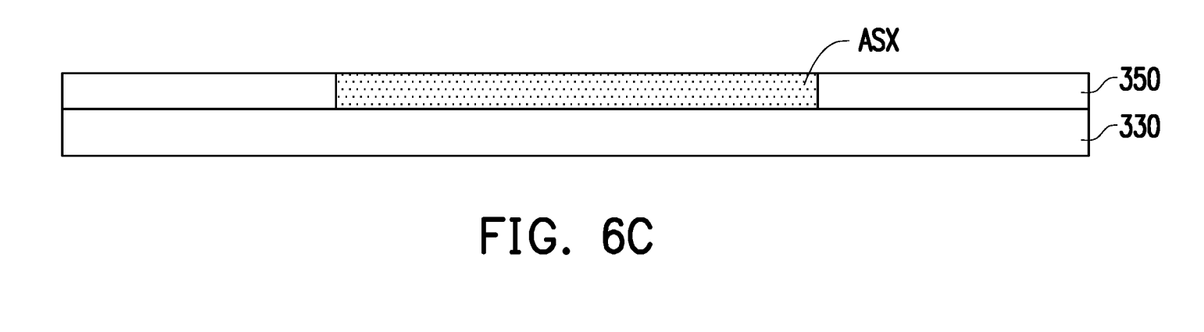

Referring to FIG. 6C, an annealing process is performed on the semiconductor pattern SP1, such that the semiconductor pattern SP1 turns into the active structures ASX (including AS1, AS2, AS3, AS4) for the NFETs and PFETs described above. In those embodiments where the semiconductor pattern SP1 is formed of amorphous silicon, the amorphous silicon may be crystallized to form polycrystalline silicon or crystalline silicon during the annealing process. Accordingly, in these embodiments, the formed active structures ASX include polycrystalline silicon or crystalline silicon. In some embodiments, the annealing process is a laser annealing process or thermal annealing process, and a process temperature of the laser annealing process may be about 400° C. As a result of such annealing process, a field effect mobility and/or other characteristics of the transistors can be significantly improved.

Figure 6D:
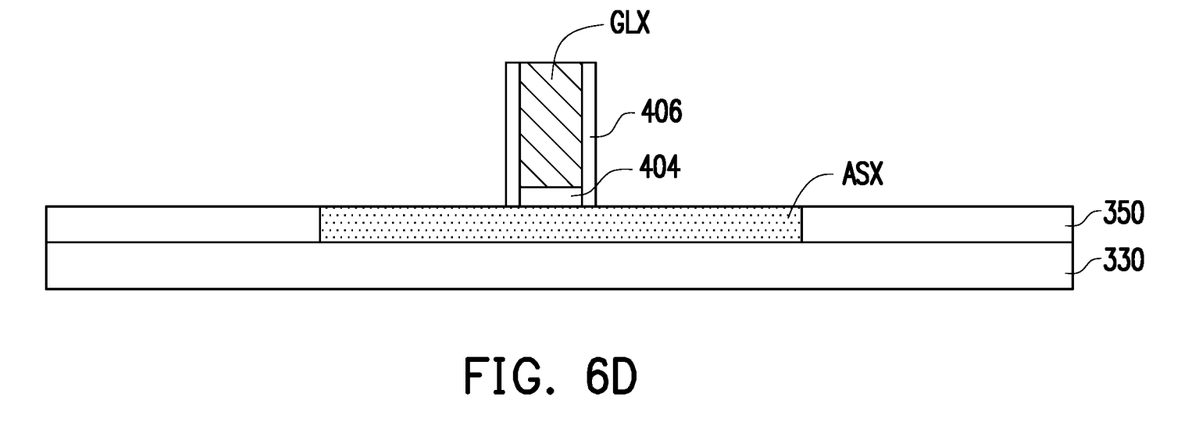

Referring to FIG. 6D, a gate structure (including GLX, 402, 404) is formed over the active structures ASX. For example, similar to that described in FIG. 5A and FIG. 5B, the gate structure includes a gate line GLX disposed over the active structure ASX; a gate dielectric layer 404 lying between the gate line GLX and the active structure ASX; and sidewalls spacers 406 covering the gate line GLX and the gate dielectric layer 404.

In some embodiments, the gate line GLX is formed of polycrystalline silicon. In these embodiments, a method for forming the gate structure may include sequentially forming a dielectric layer and a conductive layer on the active structure ASX, and patterning the dielectric layer and the conductive layer to form the gate dielectric layer 404 the gate line GLX respectively. Subsequently, the sidewall spacer 406 may be formed on sidewalls of the gate line GLX and the gate dielectric layer 404 by a deposition process and an etching back process. In alternative embodiments where the gate line GLX is formed of a metallic material, a replacement gate process may be used for forming the gate structure. Further, although not shown, a pair of lightly doped regions may be optionally formed in the active structure ASX at opposite sides of the gate line GLX before formation of the sidewall spacers 406.

Figure 6E:
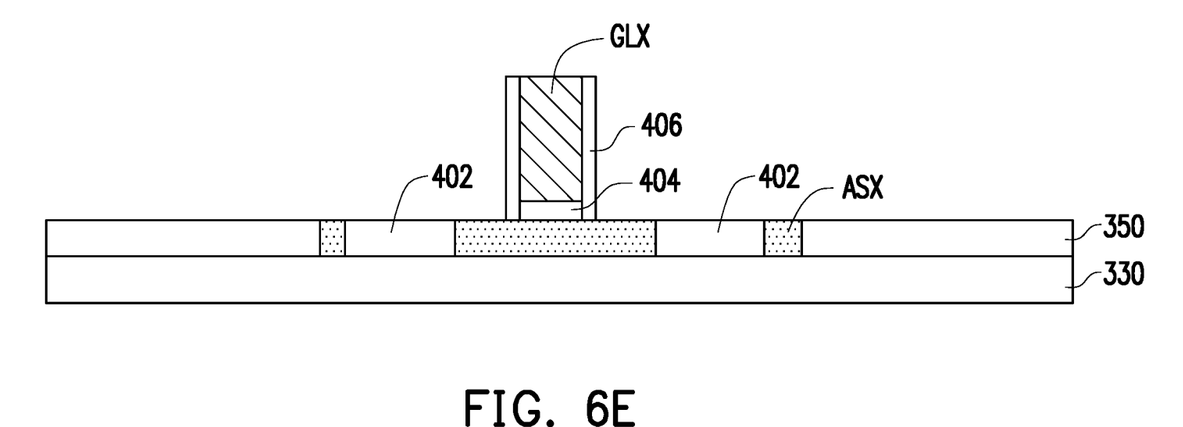

Referring to FIG. 6E, source/drain terminals 402 formed in the active structures ASX at opposite sides of the gate structure (including GLX, 402, 404). In those embodiments where the source/drain terminals 402 are doped regions in the active structure ASX, a method for forming the source/drain terminals 402 may include an ion implantation process and an annealing process. In alternative embodiments, a method for forming the source/drain terminals 402 includes forming openings in the active structure ASX, and filling the source/drain terminals 402 into these openings by, for example, an epitaxial process. Up to here, the transistors (NFETs, PFETs) located at the second level LX2 of the SRAM region SR are formed. As compared with transistors in the logic region LR formed using logic active structures 302 on the semiconductor substrate 102, the transistors in the SRAM region SR uses the active structures ASX formed from a deposited semiconductor layer. Although, the transistors located at the second level LX2 of the SRAM region SR is used as an example for description, it is noted that the transistors located at other levels (e.g. third level LX3, fourth level LX3 etc.) of the SRAM region SR in the back-end-of-line (BEOL) process may be formed in a similar manner. In other words, the process described in FIG. 6A to FIG. 6E is a BEOL compatible process.

Figure 7:
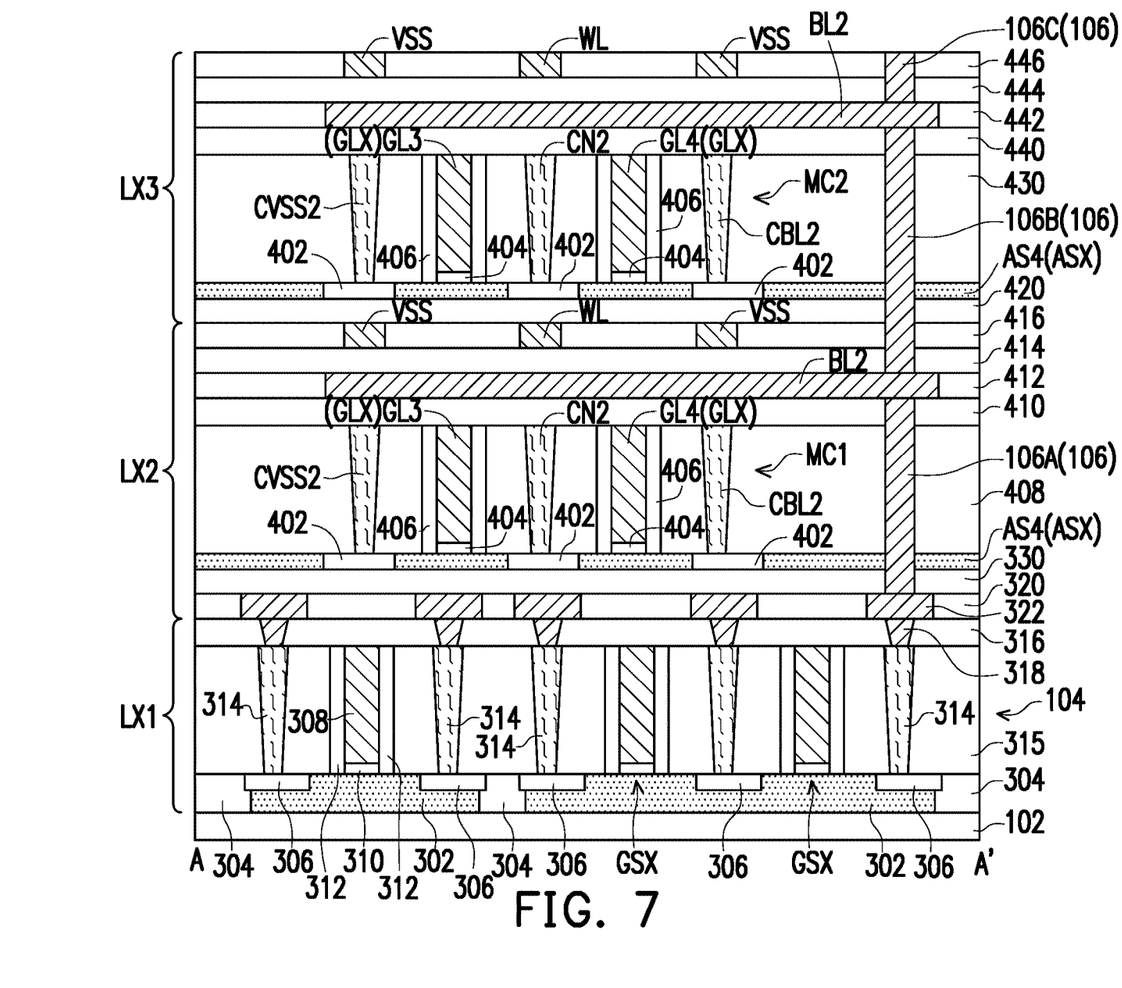
FIG. 7 is a schematic cross-sectional view of a semiconductor device taken along line A-A' shown in FIG. 4A and FIG. 4B in accordance with an alternative embodiment of the present disclosure.

FIG. 7 is a schematic cross-sectional view of a semiconductor device taken along line A-A' shown in FIG. 4A and FIG. 4B in accordance with an alternative embodiment of the present disclosure. The semiconductor device illustrated in FIG. 7 is similar to the semiconductor device shown in FIG. 5A. Therefore, the same reference numerals may be used to refer to the same or liked parts, and its detailed description will be omitted herein. The difference between the embodiment is that a third level LX3 structure is further illustrated in FIG. 7.

In the exemplary embodiment, the semiconductor device includes a plurality of first memory cells MC1 disposed at the second level LX2 over the semiconductor substrate 102 in a manner similar to that described in FIG. 5A and FIG. 5B. In some embodiments, the semiconductor device further includes a plurality of second memory cells MC2 disposed at a third level LX3 over the semiconductor substrate 102. For example, the third level LX3 is stacked on top and overlapped with the second level LX2 and the first level LX1, and each of the second memory cells MX2 includes the same components and circuits as described for the first memory cell MX1.

As illustrated in FIG. 7, in some embodiments, an interlayer dielectric 420 may be formed on the dielectric layer 416. Active structures ASX including the first active structure AS1, the second active structure AS2, the third active structure AS3 and the fourth active structure AS4 are disposed on the interlayer dielectric 420 at the third level LX3. In some embodiments, the transistors (NFETs, PFETs) located at the third level LX3 may include gate structures having gate lines GLX (including GL1, GL2, GL3, GL4). For example, each of the gate structures may include a gate line GLX (either one of GL1, GL2, GL3, GL4) disposed on the active structures ASX; a gate dielectric layer 404 lying between the gate line GLX and the active structure ASX; and sidewall spacers 406 covering sidewalls of the gate line GLX and the gate dielectric layer 404. In some embodiments, each transistor located at the third level LX3 further includes source/drain terminals 402 formed in the active structures ASX, and located at opposite sides of the gate structure. Furthermore, contact structures CSX including include bit line contacts CBL1, CBL2, a first node contact CN1, a second node contact CN2, power contacts CVdd1, CVdd2, and ground contacts CVss1, CVss2 are formed over the source/drain terminals 402 for out routing the transistors (NFETs, PFETs) located at the third level LX3.

In the exemplary embodiment, via structures (including VA1-VA8) and butted contacts (including BC1, BC2) are further disposed over the contact structures CSX for providing further interconnection (not illustrated). In some embodiments, a dielectric layer 430 is formed to surround the gate structures and the contact structures CSX in the third level LX3. In certain embodiments, another dielectric layer 440 is formed over the dielectric layer 430 to surround the via structures (including VA1-VA8) and butted contacts (including BC1, BC2). Furthermore, conductive elements CEX including a first bit line BL1, a second bit line BL2, a first word line contact CWL1, a second word line contact CWL2, interconnect structures IC1, IC2 and a power line Vdd, reference lines VSS, and a word line WL are disposed over the dielectric layer 440 for providing further interconnection (only second bit line BL2 is shown).

In some embodiments, a dielectric layer 442 is disposed on the dielectric layer 430 to surround the first bit line BL1, the second bit line BL2, the first word line contact CWL1, the second word line contact CWL2, the interconnect structures IC1, IC2 and the power line Vdd. Furthermore, dielectric layers 444, 446 are disposed on the dielectric layer 442, whereby the reference lines VSS and the word line WL are embedded in the dielectric layer 446. In the exemplary embodiment, the through vias 106 may include a first through via 106A, a second through via 106B and a third through via 106C. The first through via 106A extend from the second level LX2 to the first level LX1, and provides a vertical conduction path electrically connecting the bit lines (e.g. second bit line BL2 as illustrated) at the second level LX2 to the source/drain terminal 306 of the logic circuit 104. The second through via 106B extend from the third level LX3 to the second level LX2, and provides a vertical conduction path electrically connecting the bit lines (e.g. second bit line BL2 as illustrated) at the third level LX3 to the first through via 106A and to the source/drain terminal 306 of the logic circuit 104. Similarly, the third through via 106C may extend from the above levels (if present) to electrically connect the bit lines from the above levels to the source/drain terminal 306 of the logic circuit 104. In a similar way, auxiliary through vias (not shown) may extend from the third level LX3 to the second level LX2, and from the second level LX2 to the first level LX1, to provide a vertical conduction path electrically connecting the word line WL at each level of the SRAM region SR to the source/drain terminal 306 of the logic circuit 104.

According to the above embodiments, the semiconductor device includes a logic circuit disposed at a first level over the semiconductor substrate, and a SRAM region including a plurality of memory cells disposed at a second level over the semiconductor substrate. As such, by deploying the memory cells of the semiconductor device at different horizontal levels with the logic circuit, a footprint area of the semiconductor device can be significantly reduced. Furthermore, the memory cells do not occupy the front-end-of-line (FEOL) area, thus the chip area and costs of the semiconductor device can be reduced to a minimum.

In accordance with some embodiments of the present disclosure, a semiconductor device includes a semiconductor structure, a logic circuit, a plurality of first memory cells and through vias. The logic circuit is disposed at a first level over the semiconductor substrate. The first memory cells are disposed at a second level over the semiconductor substrate, wherein the second level is stacked on top and overlapped with the first level. Each of the first memory cells include a latch circuit and conductive elements. The latch circuit is formed of N-type field effect transistors (NFETs) and P-type field effect transistors (PFETs). The conductive elements are extending above the NFETs and the PFETs and electrically coupled to the NFETs and the PFETs. The through vias are extending from the second level to the first level and electrically connecting the conductive elements to the logic circuit by a vertical conduction path.

In accordance with some other embodiments of the present disclosure, a semiconductor device includes a logic circuit, an interlayer dielectric, a static random access memory (SRAM) cell and a through via. The logic circuit includes logic active structures and gate structures. The logic active structures are disposed at a first level on a semiconductor substrate. The gate structures are disposed at the first level, wherein the gate structures cover and intersect with the logic active structures. The interlayer dielectric is disposed on the semiconductor substrate covering the logic circuit. The SRAM cell is disposed on the logic circuit above the interlayer dielectric, and includes a first active structure and a second active structure, a first gate line and a second gate line, a bit line contact and a first bit line. The first active structure and the second active structure are disposed on the interlayer dielectric at a second level on the semiconductor substrate. The first gate line and the second gate line are disposed on the interlayer dielectric at the second level, wherein the first gate line covers and intersects with the first active structure, and the second gate line covers and intersects with the first active structure and the second active structure. The bit line contact is disposed on the first active structure aside the first gate line at the second level on the semiconductor substrate. The first bit line is extending above the bit line contact and electrically connected to the bit line contact. The through via is vertically connecting the first bit line to a source/drain region of the logic active structures.

In accordance with yet another embodiment of the present disclosure, a semiconductor device includes a logic region, a static random access memory (SRAM) region and a plurality of through vias. The logic region is formed on a semiconductor substrate. The SRAM region is formed on the logic region within an area overlapped with the logic region. The SRAM region includes a first SRAM memory array and a second SRAM memory array. The first SRAM memory array includes a plurality of first memory cells. The second SRAM memory array is stacked on top of the first SRAM memory array and includes a plurality of second memory cells. The through vias provide a vertical conduction path electrically connecting the first SRAM memory array and the second SRAM memory array to the logic region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
  a semiconductor substrate;
  a logic circuit disposed at a first level over the semiconductor substrate;

a plurality of first memory cells disposed at a second level over the semiconductor substrate, wherein the second level is stacked on top and overlapped with the first level, and each of the plurality of first memory cells comprise:
  a latch circuit formed of N-type field effect transistors (NFETs) and P-type field effect transistors (PFETs); and
  conductive elements extending above the NFETs and the PFETs and electrically coupled to the NFETs and the PFETs;
through vias extending from the second level to the first level and electrically connecting the conductive elements to the logic circuit by a vertical conduction path; and
auxiliary through vias extending from the second level to the first level and electrically connecting the conductive elements to the logic circuit by a second vertical conduction path, wherein the through vias are connected to the conductive elements extending in a first direction, and the auxiliary through vias are connected to the conductive elements extending in a second direction perpendicular to the first direction.

2. The semiconductor device according to claim 1, further comprising:
a plurality of second memory cells disposed at a third level over the semiconductor substrate, wherein the third level is stacked on top and overlapped with the second level and the first level, and each of the plurality of second memory cells comprise:
  a second latch circuit formed of second N-type field effect transistors (second NFETs) and second P-type field effect transistors (second PFETs); and
  second conductive elements extending above the second NFETS and the second PFETS and electrically coupled to the second NFETS and the second PFETS; and
second through vias extending from the third level to the second level and electrically connecting the second conductive elements to the through vias by the vertical conduction path.

3. The semiconductor device according to claim 1, wherein the NFETs comprise a first pull down transistor and a second pull down transistor, the PFETs comprise a first pull up transistor and a second pull up transistor, a source/drain terminal of the first pull down transistor is electrically coupled to a source/drain terminal of the first pull up transistor, and a source/drain terminal of the second pull down transistor is electrically coupled to a source/drain terminal of the second pull down transistor.

4. The semiconductor device according to claim 3, wherein each of the plurality of first memory cells further comprises a first access transistor and a second access transistor coupled to first and second storage nodes of the latch circuit.

5. The semiconductor device according to claim 4, wherein the conductive elements comprise a first bit line coupled to the first access transistor and a second bit line coupled to the second access transistor, and wherein the first bit line and the second bit line are physically joined with the through vias.

6. The semiconductor device according to claim 4, wherein the conductive elements further comprise a first word line contact coupled to the first access transistor and a second word line contact coupled to the second access transistor.

7. The semiconductor device according to claim 1, wherein the plurality of first memory cells is arranged as a first array at the second level over the semiconductor substrate, and wherein the through vias are located in a central region of the first array, and the auxiliary through vias are located in a peripheral region of the first array.

8. A semiconductor device, comprising:
a logic circuit, comprising:
  logic active structures disposed at a first level on a semiconductor substrate; and
  gate structures disposed at the first level, wherein the gate structures cover and intersect with the logic active structures;
an interlayer dielectric disposed on the semiconductor substrate covering the logic circuit;
a static random access memory (SRAM) cell disposed on the logic circuit above the interlayer dielectric, and comprising:
  a first active structure and a second active structure disposed on the interlayer dielectric at a second level on the semiconductor substrate;
  a first gate line and a second gate line disposed on the interlayer dielectric at the second level, wherein the first gate line covers and intersects with the first active structure, and the second gate line covers and intersects with the first active structure and the second active structure;
  a bit line contact disposed on the first active structure aside the first gate line at the second level on the semiconductor substrate; and
  a first bit line extending above the bit line contact and electrically connected to the bit line contact;
a through via vertically connecting the first bit line to a source/drain region in the logic active structures;
first isolation structures formed at the first level on the semiconductor substrate and separating the logic active structures; and
a second isolation structure formed at the second level on the semiconductor substrate and separating the first active structure from the second active structure.

9. The semiconductor device according to claim 8, wherein a height of the second isolation structure is equal to a height of the first active structure and a height of the second active structure.

10. The semiconductor device according to claim 8, further comprising:
a third active structure and a fourth active structure disposed on the interlayer dielectric at the second level on the semiconductor substrate; and
a third gate line and a fourth gate line disposed on the interlayer dielectric at the second level, wherein the third gate line covers and intersects with the third active structure and the fourth active structure, and the fourth gate line covers and intersects with the fourth active structure.

11. The semiconductor device according to claim 10, further comprising:
a second bit line contact disposed on the fourth active structure aside the fourth gate line at the second level on the semiconductor substrate;
a second bit line extending above the second bit line contact and electrically connected to the second bit line contact; and
a second through via vertically connecting the second bit line to another source/drain region in the logic active structures.

12. The semiconductor device according to claim 8, further comprising:
- a first word line contact extending above the first gate line; and
- a word line extending above the first word line contact and coupled to the first word line contact.

13. The semiconductor device according to claim 12, further comprising:
- an auxiliary through via vertically connecting the word line to another source/drain region of the logic active structures.

14. The semiconductor device according to claim 8, further comprising interconnection patterns embedded in the interlayer dielectric and electrically connecting the through via to the source/drain region in the logic active structures.

15. A semiconductor device, comprising:
- a logic region formed on a semiconductor substrate;
- a static random access memory (SRAM) region formed on the logic region within an area overlapped with the logic region, wherein the SRAM region comprises:
  - a first SRAM memory array comprising a plurality of first memory cells; and
  - a second SRAM memory array stacked on top of the first SRAM memory array and comprising a plurality of second memory cells; and
- a plurality of through vias providing a vertical conduction path electrically connecting the first SRAM memory array and the second SRAM memory array to the logic region, wherein the plurality of through vias is located in a central region of the first SRAM memory array and in a central region of the second SRAM memory array.

16. The semiconductor device according to claim 15, further comprising a plurality of auxiliary through vias providing a second vertical conduction path electrically connecting the first SRAM memory array and the second SRAM memory array to the logic region.

17. The semiconductor device according to claim 16, wherein the plurality of auxiliary through vias is located in a peripheral region of the first SRAM memory array and in a peripheral region of the second SRAM memory array.

18. The semiconductor device according to claim 15, wherein each of the plurality of first memory cells and each of the plurality of second memory cells comprises a first inverter and a second inverter, cross-coupled with each other, the first inverter comprises a first N-type field effect transistor (NFET) and a first P-type field effect transistor (PFET) coupled with the first NFET by a common source/drain terminal, the second inverter comprises a second NFET and a second PFET coupled with the second NFET by a common source/drain terminal.

19. The semiconductor device according to claim 15, wherein the logic region comprises at least one transistor having a source/drain terminal, and the plurality of through vias is electrically connected to the source/drain terminal through the vertical conduction path.

20. The semiconductor device according to claim 15, wherein the plurality of through vias comprises first through vias located in the central region of the first SRAM memory array, and second through vias located in the central region of the second SRAM memory array, wherein the second through vias are electrically connecting the second SRAM memory array to the logic region through the vertical conduction path that passes through the first through vias.

* * * * *